United States Patent
Rieh et al.

(10) Patent No.: US 10,930,620 B2
(45) Date of Patent: Feb. 23, 2021

(54) MULTI-CHIP DETECTOR APPRATUS

(71) Applicant: KOREA UNIVERSITY RESEARCH AND BUSINESS FOUNDATION, Seoul (KR)

(72) Inventors: Jae-Sung Rieh, Seoul (KR); Ki Ryong Song, Seoul (KR); Jai Heon Cho, Seoul (KR); DoYoon Kim, Suwon-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/505,908

(22) Filed: Jul. 9, 2019

(65) Prior Publication Data
US 2020/0043898 A1    Feb. 6, 2020

(30) Foreign Application Priority Data

Aug. 1, 2018 (KR) .......... 10-2018-0090042

(51) Int. Cl.
| | |
|---|---|
| *H01L 25/065* | (2006.01) |
| *H01L 25/00* | (2006.01) |
| *H01Q 9/04* | (2006.01) |
| *G01S 13/89* | (2006.01) |
| *H01L 23/00* | (2006.01) |
| *H01L 25/18* | (2006.01) |
| *G01S 13/02* | (2006.01) |

(52) U.S. Cl.
CPC .......... *H01L 25/0657* (2013.01); *G01S 13/89* (2013.01); *H01L 24/06* (2013.01); *H01L 24/48* (2013.01); *H01L 25/18* (2013.01); *H01L 25/50* (2013.01); *H01Q 9/0407* (2013.01); *G01S 2013/0245* (2013.01); *H01L 2223/6677* (2013.01); *H01L 2224/48137* (2013.01); *H01L 2225/06513* (2013.01); *H01L 2924/14* (2013.01); *H01L 2924/15321* (2013.01)

(58) Field of Classification Search
CPC .......... H01L 21/4857; H01L 23/49822; H01L 23/49827
USPC .......................................... 257/690
See application file for complete search history.

(56) References Cited

U.S. PATENT DOCUMENTS

| | | | |
|---|---|---|---|
| 2017/0104019 A1* | 4/2017 | Jung ............. | H04N 5/378 |
| 2018/0076336 A1* | 3/2018 | De Graff .......... | A61B 1/05 |

FOREIGN PATENT DOCUMENTS

| | | |
|---|---|---|
| JP | 5717842 B2 | 5/2015 |
| KR | 10-0810383 B1 | 3/2008 |

* cited by examiner

*Primary Examiner* — Elias Ullah
(74) *Attorney, Agent, or Firm* — NSIP Law (57) ABSTRACT

The present invention relates to a multi-chip detector apparatus composed of multiple single detectors. An embodiment of the invention provides a multi-chip detector apparatus having a multiple number of single chips arranged in inter-chip connection on a substrate, where the multi-chip detector apparatus includes: a first single chip that has a multiple number of single detectors formed in m rows and n columns; a second single chip that is positioned at either a left side or a right side of the first single chip and is connected row-wise with the first single chip; and a third single chip that is positioned at either an upper side or a lower side of the first single chip and is connected column-wise with the first single chip, and where the second single chip and the third single chip also have multiple numbers of single detectors formed in m rows and n columns.

2 Claims, 10 Drawing Sheets

Image
Object 10 x 10

30 x 30

MULTI-CHIP DETECTOR APPRATUS

CROSS-REFERENCE TO RELATED APPLICATIONS

This application claims the benefit of Korean Patent Application No. 10-2018-0090042, filed with the Korean Intellectual Property Office on Aug. 1, 2018, the disclosure of which is incorporated herein by reference in its entirety.

BACKGROUND

1. Technical Field

The present invention relates to a multi-chip detector apparatus, more particularly to a multi-chip detector apparatus that is composed of a multiple number of single detectors.

2. Description of the Related Art

An antenna is a device that emits or receives waves for communication purposes. The shape of an antenna can vary according to the frequency used. An example of the related art may be found in Korean Registered Patent No. 10-1163654.

Increases in transistor operation frequency, brought about by advances in semiconductor processing technology, have made it easier to implement circuit approaches at extremely high frequency bands such as millimeters, terahertz, etc. This has led to active research in imaging systems, etc., utilizing broadband communication systems and frequency characteristics.

An increase in circuit operation frequency leads to a decrease in antenna size. The area of an antenna operating on a millimeter or terahertz band is small, on the scale of mm2 also smaller, so that several antennas can be integrated onto one chip. This makes possible an antenna array or an on-chip implementation.

An antenna array of a millimeter or terahertz band is often utilized in communication system, imaging system. In the case of a communication system, phased antenna array may be used at the transmitter and receiver ends to transmit and receive signals in the desired directions by way of beam forming. For an imaging circuit, each antenna of an antenna array at the receiver end may be assigned a pixel to obtain a multi-pixel image.

While it is thus possible to provide systems and antenna arrays as on-chip implementations, there is a limit to how many antennas can be integrated onto a single chip, so that it is difficult to provide an antenna array with the level of performance required for the system.

Therefore, there is a need for a technology that can increase the performance of an on-chip antenna array without increasing the size of the chip.

SUMMARY OF THE INVENTION

An objective of the present invention is to provide a multi-chip detector apparatus that utilizes multiple chips to overcome the performance limitations of a detector array used in an imaging system.

An embodiment of the present invention, conceived to achieve the objective above, provides a multi-chip detector apparatus having a multiple number of single chips arranged in inter-chip connection on a substrate, where the multi-chip detector apparatus includes: a first single chip that has a multiple number of single detectors formed in m rows and n columns, said m and n being natural numbers; a second single chip that is positioned at either one of a left side and a right side of the first single chip and is connected row-wise with the first single chip; and a third single chip that is positioned at either one of an upper side and a lower side of the first single chip and is connected column-wise with the first single chip, and where the second single chip and the third single chip also have multiple numbers of single detectors formed in m rows and n columns.

A multi-chip detector apparatus according to an embodiment of the invention can use multiple chips to provide an antenna array in a size that cannot be implemented with a single chip. The increase in the number of antennas can allow an increase in the number of pixels for an image, thereby increasing the resolution of the acquired image.

Additional aspects and advantages of the present invention will be set forth in part in the description which follows, and in part will be obvious from the description, or may be learned by practice of the invention.

DETAILED DESCRIPTION OF THE INVENTION

A detailed description is provided below, with reference to the accompanying drawings, of a multi-chip detector apparatus related to an embodiment of the invention.

In the present specification, an expression used in the singular encompasses the expression of the plural, unless it has a clearly different meaning in the context. In the specification, terms such as "including" or "having," etc., should not be interpreted as meaning that every one of the various elements or the various operations disclosed in the specification must necessarily be included. Rather, such terms should be interpreted as meaning that some of the elements or some of the operations may not be included and that additional elements or operations can further be included.

Figure 1:
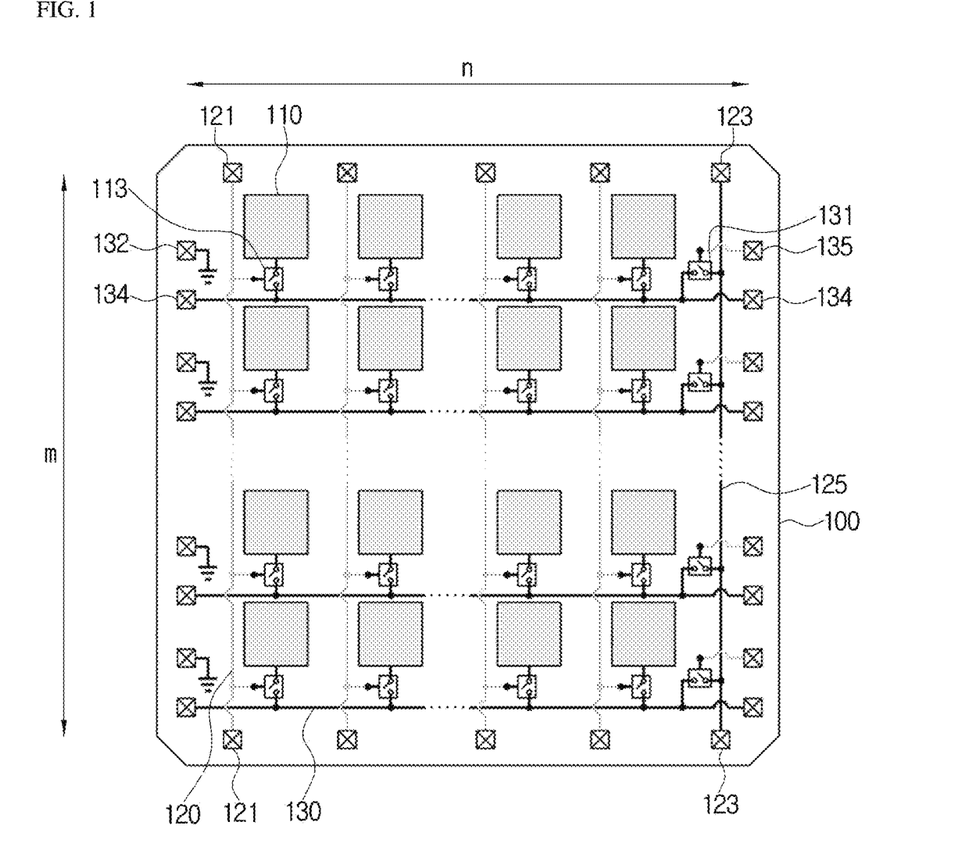
FIG. 1 is a circuit diagram of a single chip in a multi-chip detector apparatus related to an embodiment of the invention.

FIG. 1 is a circuit diagram of a single chip in a multi-chip detector apparatus related to an embodiment of the invention.

As shown in the illustration, a single chip 100 may have single detectors 110 arranged in a 2-dimensional arrangement of m rows and n columns. While the descriptions below use an example in which the array of single detectors has a quadrilateral form, the single detectors can also be arranged in arrays of various shapes such as triangles, pentagons, etc.

The single detector 110 can include an antenna (not shown). For the antenna, various types of integrated antennas can be used, such as dipole antennas, patch antennas, etc. The single detector 110 can include an integrated detector made of a diode or transistor, etc. The output of the detector 110 array may be serial data.

The single detector 110 may be connected with a column selection switch 113. In the embodiment described below, the column selection switch 113 in its basic form may be turned on at a high voltage and may be turned off at a low voltage, i.e. the ground (GND).

In the single chip 100, a switch control line 120 may be arranged in correspondence to each column of single detectors, and a signal line 130 may be arranged in correspondence to each row of single detectors.

The column selection switches present in the same column may be connected with one switch control line 120, and both ends of a switch control line 120 may be connected with a column switch control pad 121 positioned above and below. A separate column switch control pad can be used for each column.

The signal lines 130 positioned in each row may all be connected in parallel. For multi-chip use, the signal lines 130 continuing in the respective rows may be separated. Signal lines 130 that do not pass a row selection switch 131 may be connected with horizontal connection pads 134 positioned at the left and right ends. Also, signal lines 130 may pass through a row selection switch 131 to be connected with a signal line 125 positioned on the right side.

While the embodiment illustrated in the drawing uses an example in which the row selection switch control pads 135 are positioned on the right side of the single chip 100, it is also possible to have the row selection switch control pads 135 positioned on the left side of the single chip 100.

Unlike the column selection switches, there may be just one row selection switch 131 in each row. On the left side of the single chip 100, there may be positioned ground (GND) pads 132. The ground (GND) pads 132 may be used for deactivating unused row selection switches 131. The signal line 125 positioned at the rightmost side of the single chip 100 may be connected with vertical connection pads 123 positioned above and below.

Another single chip identical to the single chip 100 can be connected at the top, bottom, left, or right. That is, inter-chip connections may be implemented for the single chip 100 to form a multi-chip detector apparatus.

Although it is not shown in the drawings, it is also possible to have the signal lines and switch control lines arranged along the row direction and have the signal lines arranged along the column direction.

Figure 2:
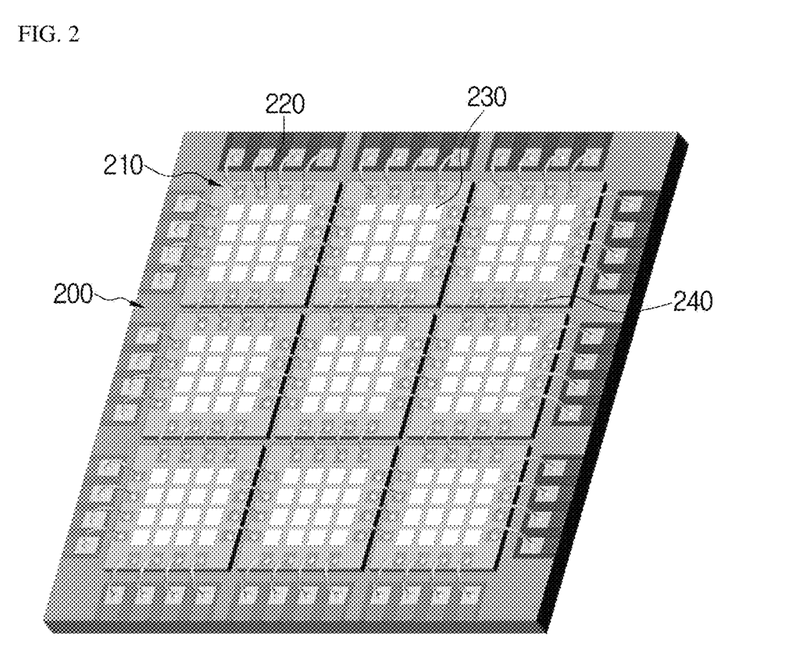
FIG. 2 and FIG. 3 are diagrams for explaining inter-chip connections for single chips.

FIG. 2 shows a method of interconnecting chips with a wire bonding technique. As shown in the illustration, single chips 210 may be arranged in a square shape over a substrate 200. In the illustrated figure, connections to an external control unit and a signal processing unit are omitted. With the wire bonding technique, the pads 220 for providing inter-chip connections may be positioned on the same surface as the single detectors 230.

Also, connections between single chips in the left and right directions may be provided via pads positioned along the row direction, and connections between single chips in the up and down directions may be provided via pads positioned along the column direction. In this case, connections between pads may be provided via wires 240.

Figure 3:
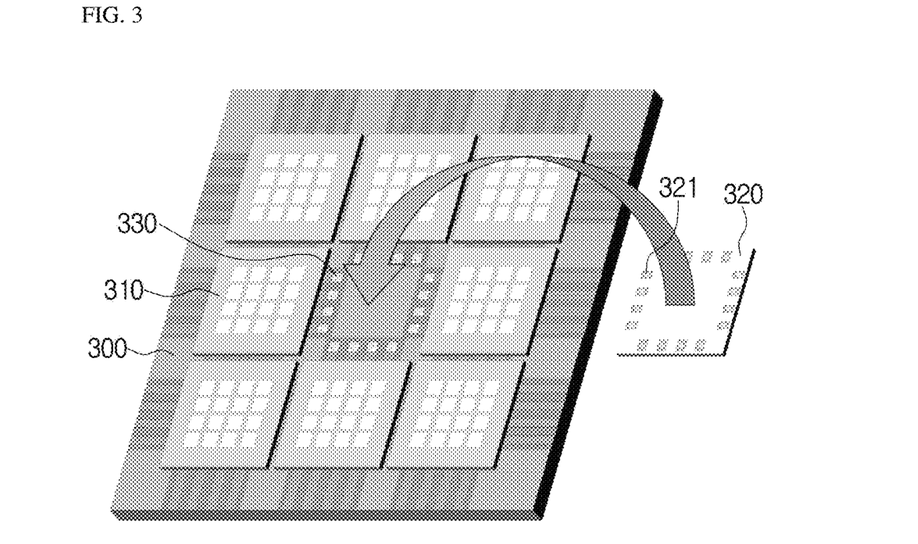

FIG. 3 shows a method of interconnecting chips with a flip-chip bonding technique.

As shown in the illustration, single chips 310 may be arranged in a square shape over a substrate 300. In the illustrated figure, connections to an external control unit and a signal processing unit are omitted. With the flip-chip bonding technique, a single chip 320 at the right side of FIG. 3 may be flipped for mounting onto the substrate 300. The single chips and the substrate may be connected by way of ball bonding. The pads 321 on the single chip may be connected with the balls 330 formed on the substrate.

Figure 4:
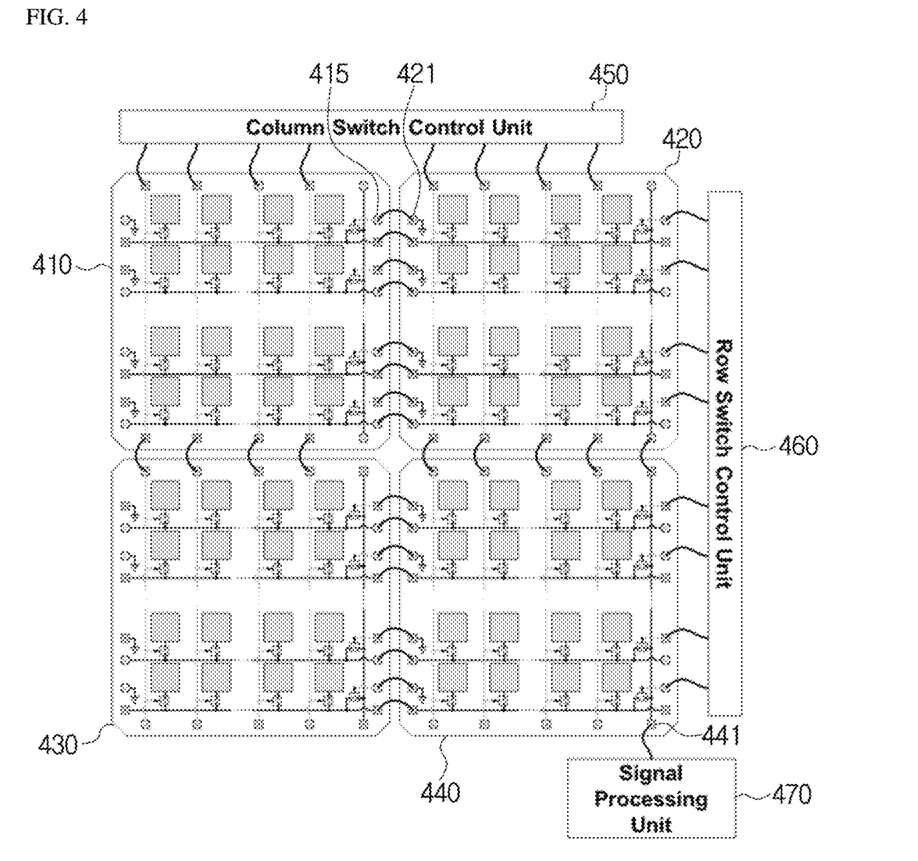
FIG. 4 illustrates a multiple number of single chips and an external control unit connected together in a multi-chip detector apparatus related to an embodiment of the invention.

FIG. 4 illustrates a multiple number of single chips and an external control unit connected together in a multi-chip detector apparatus related to an embodiment of the invention.

As shown in the illustration, a first single chip 410 may be connected with a second single chip 420 along the row direction and, along the column direction, may be connected with a third single chip 430. In addition, the third single chip 430 may be connected along the row direction with a fourth single chip 440. Also, the fourth single chip 440 may be connected with the second single chip 420 in the column direction.

Although the illustrated embodiment uses an example having four chips arranged in a 2×2 array, it is possible to decrease or increase the size of the array by adjusting the number of chips as necessary.

The outlying single chips 410, 420, 440 may be connected with external control units 450, 460. The control unit 450 at the top side may be a unit for controlling the column selection switches, while the control unit 460 at the right side may be a unit for controlling the row selection switches. As the output may be in the form of serial data, the data may be outputted through a vertical connection pad 441 and a path connected to a signal processing unit 470.

Between single chips that are adjacent along the row direction, a switch control pad may be connected with the ground pad of the other single chip. Further, it is also possible for single chips adjacent along the row direction to be connected by way of horizontal connection pads connected to each other. For example, the switch control pad of the first single chip 410 may be connected with the ground pad of the second single chip 420, and a horizontal connection pad of the first single chip 410 can be connected with the horizontal connection pad of the second single chip 420 positioned in the same row.

Through a connection between the ground pad 421 of the second single chip 420 and an unused row selection switch 415 of the first single chip 410, the corresponding row selection switch 415 can be closed permanently.

Figure 5:
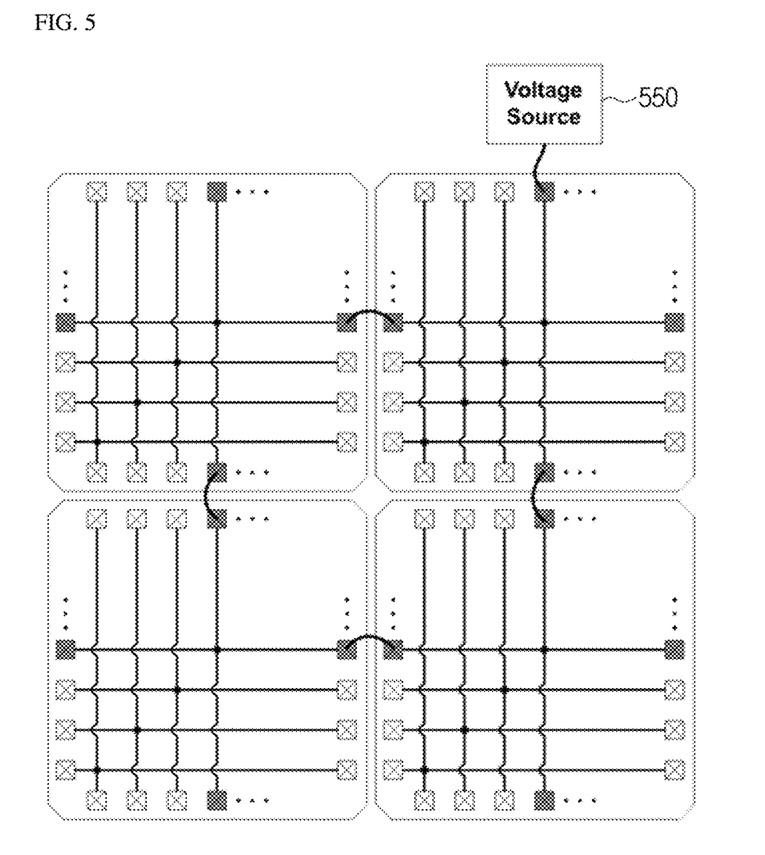
FIG. 5 illustrates bias connections between single chips in a multi-chip detector apparatus related to an embodiment of the invention.

FIG. 5 illustrates bias connections between single chips in a multi-chip detector apparatus related to an embodiment of the invention.

As shown in the illustration, one of the pads positioned at the top side may be connected with a voltage source 550. FIG. 5 shows how bias may be supplied for operating the inner circuits over the entirety of the multiple chips. That is, the voltage source 550 can be connected with one single chip, and bias for operating the inner circuits can be supplied via inter-chip connection.

Figure 6:
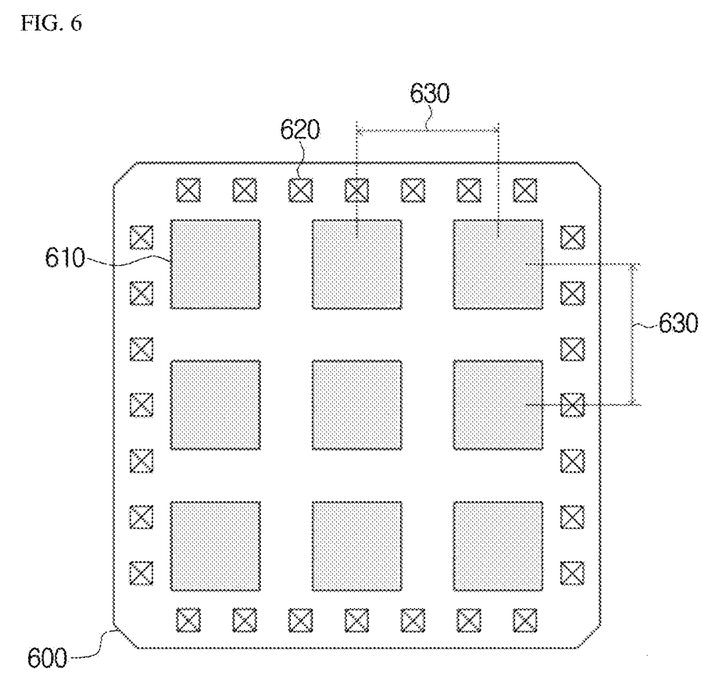
FIG. 6 illustrates the layout of a single chip in a multi-chip detector apparatus related to an embodiment of the invention.

FIG. 6 illustrates the layout of a single chip in a multi-chip detector apparatus related to an embodiment of the invention.

In the single chip 600 shown in the figure, only the single detectors 610 and pads 620 are illustrated. Along the perimeter of the chip, pads 620 for external connections are aligned. The pads 620 can include any type of pad for connecting to control units, external bias, and adjacent chips. The areas of the pads 620 may be in sizes that allow electrical connections to the substrate such as via wire bonding or flip-chip bonding, etc. Each antenna can be positioned such that the distances 630 between the centers maintain a half-wavelength ($\lambda/2$) of the operating frequency.

Figure 7A:
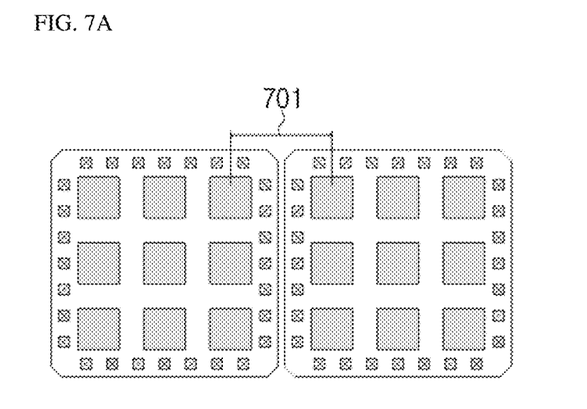
FIG. 7A shows two chips positioned as closely together as possible.
Figure 7B:
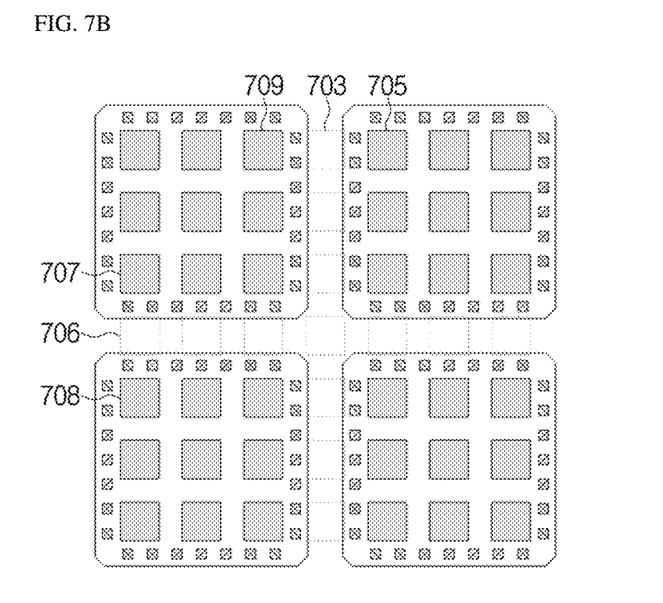
FIG. 7B shows an arrangement in which the gaps between chips have been purposefully increased such that the distances between antenna centers are multiples of the half-wavelength ($\lambda/2$).

FIGS. 7A and 7B illustrate multi-chip arrays composed of single chips.

FIG. 7A shows two chips positioned as closely together as possible. In cases where the distance 701 to the single detector in the neighboring chip is not the half-wavelength ($\lambda/2$), the distance may be adjusted to a multiple of half-wavelength ($\lambda/2$).

FIG. 7B shows an arrangement in which the gaps between chips have been purposefully increased such that the distances between antenna centers are multiples of the half-wavelength ($\lambda/2$). In this case, a space of one pixel 703 may be empty between chips.

When image data is obtained with a multi-chip array such as that of FIG. 7B, information corresponding to an entire column 703 or row 706 between the chips would be missing. If an image is recreated with such data, the quality of the image would be drastically lowered, as the information between pixels is not continuous. Thus, a method may be used of processing the overall image by artificially generating data for the empty pixels. An interpolation technique can be used, such as by using average values between the left-side single detectors 704 of the first single chip and the right-side single detectors 705 of the second single chip for the part 703 where data for a column is missing and using average values between the bottom-side single detectors 707 of the first single chip and the top-side single detectors 708 of the third single chip for the part 706 where data for a row is missing, to thereby increase the quality of the image.

Figure 8:
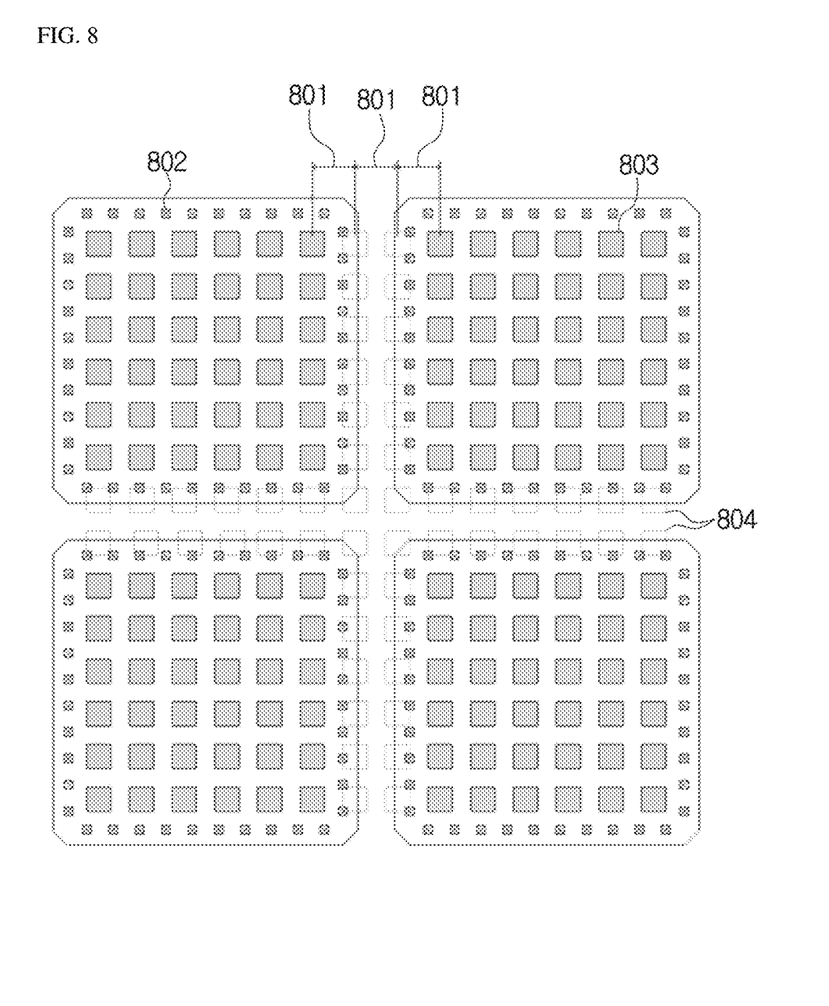
FIG. 8 shows a detector array that operates at a relatively higher frequency compared to the arrangement illustrated in FIG. 6.

FIG. 8 shows a detector array that operates at a relatively higher frequency compared to the arrangement described above with reference to FIG. 6.

As shown in the illustration, it is supposed that the sizes of the pads 802 are the same as the pads 620 shown in the previously described drawings. Whereas the areas of the pads 802 may not change, an increase in the operating frequency may cause the areas of the antennas to continuously decrease, until the areas are comparatively not much different from the areas of the pads. Furthermore, the distance 801 of the half-wavelength ($\lambda/2$) may also be shortened, so that the multiple of the half-wavelength that has to be maintained from the antenna of the adjacent chip may be gradually increased. Thus, the number of single detectors 803 corresponding to empty pixels 804 may be gradually increased.

Figure 9:
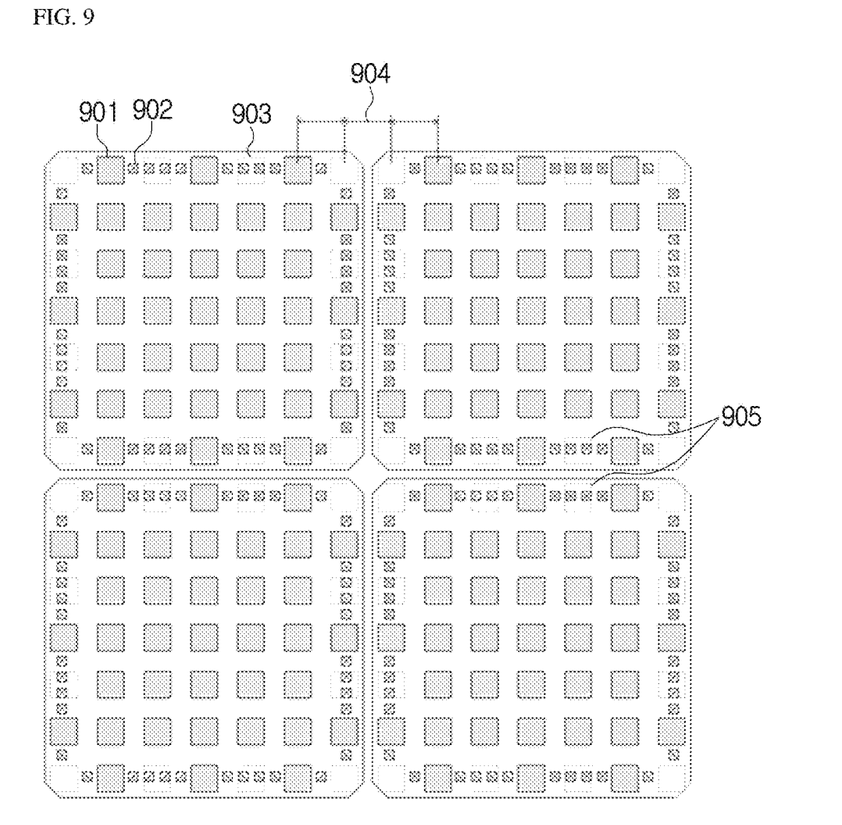
FIG. 9 illustrates the layout of a multi-chip detector apparatus related to another embodiment of the invention.

FIG. 9 illustrates the layout of a multi-chip detector apparatus related to another embodiment of the invention.

As shown in the illustration, the arrangement of the single detectors 901 and pads 902 may be different from that shown in FIG. 6. Whereas FIG. 6 has the pads 620 surrounding the antenna array, FIG. 9 has the single detector arrays extended to the edges of the chips and has the pads 902 embedded at portions 903 where single detectors should be positioned. Unlike the arrangement shown in FIG. 7, there is no need to artificially keep a space between two chips corresponding to a distance 904 of a half-wavelength ($\lambda/2$). Also, there are no empty pixels over an entire column or row as in FIG. 7 and FIG. 8, but rather the empty spaces 905 are more sparsely distributed. In other words, the number of pixels that are to be artificially generated by an interpolation technique can be reduced.

Figure 10:
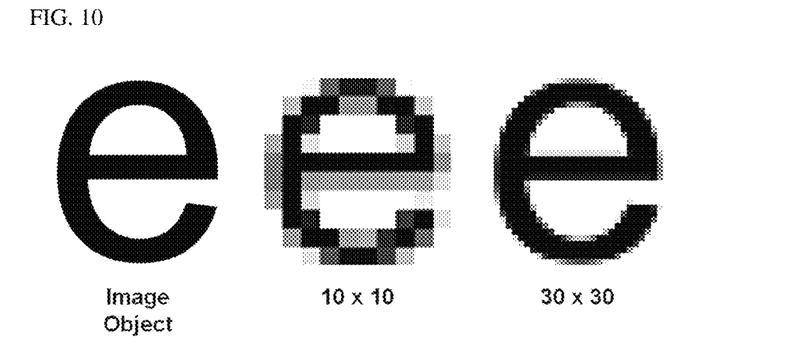
FIG. 10 shows an image detected by using a multi-chip detector apparatus according to an embodiment of the invention compared with an image detected by a single-chip detector.

FIG. 10 shows an image detected by using a multi-chip detector apparatus according to an embodiment of the invention compared with an image detected by a single-chip detector.

The image corresponding to 10×10 is an image obtained by using a single-chip detector, and the image corresponding to 30×30 is an image obtained after increasing the pixels to 30×30 by using nine single-chip detectors placed in a 3×3 arrangement.

From the illustration, it can be observed that, when the image is obtained by using a multi-chip detector apparatus having several single chips connected together, the resolution may be considerably increased, compared to when such an apparatus is not used.

As described above, a multi-chip detector apparatus according to an embodiment of the invention can use multiple chips to provide an array of single detectors in a size that cannot be implemented with a single chip. An increase in the number of single detectors allows in an increase in the number of image pixels, making it possible to increase the resolution of the acquired image.

It should be appreciated that the multi-chip detector apparatus described above is not limited to the compositions and methods associated with the embodiments described above. Rather, the whole of or parts of different embodiments can be selectively combined to achieve various modifications.

What is claimed is:

1. A multi-chip detector apparatus having a plurality of single chips arranged in inter-chip connection on a substrate, the multi-chip detector apparatus comprising:
 a first single chip having a plurality of single detectors formed in m rows and n columns, said m and n being natural numbers;
 a second single chip positioned at either one of a left side and a right side of the first single chip, the second single chip connected row-wise with the first single chip; and
 a third single chip positioned at either one of an upper side and a lower side of the first single chip, the third single chip connected column-wise with the first single chip,
 wherein the second single chip and the third single chip also have a plurality of single detectors formed in m rows and n columns,
 wherein the first single chip further comprises:
 a switch control line formed in either one of a column direction and a row direction in which the plurality of single detectors are arranged, the switch control line connected with single detectors of a corresponding column or a corresponding row;
 a signal line formed in a direction different from a direction in which the switch control line is formed, the signal line formed corresponding to each column or each row of an arrangement of the plurality of single detectors;
 a row selection switch connected with either one of a left end and a right end of the signal line formed for each row; and a ground pad formed at an opposite end of the row selection switch, and wherein a switch control pad of the first single chip is connected with a ground pad of the second single chip.

2. The multi-chip detector apparatus of claim 1, wherein a first outermost single detector and a second outermost single detector present within a same single chip have a pad arranged in-between in a column direction or a row direction for inter-chip connection.

* * * * *